US008808581B2

(12) United States Patent
Vernooy et al.

(10) Patent No.: US 8,808,581 B2
(45) Date of Patent: Aug. 19, 2014

(54) CONDUCTIVE COMPOSITIONS CONTAINING $LI_2RUO_3$ AND ION-EXCHANGED $LI_2RUO_3$ AND THEIR USE IN THE MANUFACTURE OF SEMICONDUCTOR DEVICES

(75) Inventors: Paul Douglas Vernooy, Hockessin, DE (US); Chieko Kikuchi, Kanagawa (JP); Kazutaka Ozawa, Kanagawa (JP)

(73) Assignee: E I du Pont de Nemours and Company, Wilmington, DE (US)

( * ) Notice: Subject to any disclaimer, the term of this patent is extended or adjusted under 35 U.S.C. 154(b) by 273 days.

(21) Appl. No.: 13/568,260

(22) Filed: Aug. 7, 2012

(65) Prior Publication Data

US 2013/0043440 A1 Feb. 21, 2013

Related U.S. Application Data

(60) Provisional application No. 61/523,591, filed on Aug. 15, 2011.

(51) Int. Cl.

*H01B 1/16* (2006.01)
*H01B 1/22* (2006.01)
*H01L 31/0224* (2006.01)

(52) U.S. Cl.

CPC .................................... *H01B 1/22* (2013.01)
USPC ............................ 252/512; 252/514; 136/252

(58) Field of Classification Search

USPC ........................... 252/512–514; 136/252–256
See application file for complete search history.

(56) References Cited

U.S. PATENT DOCUMENTS

| | | | | |
|---|---|---|---|---|
| 4,539,223 | A * | 9/1985 | Hormadaly | 427/102 |
| 5,491,118 | A * | 2/1996 | Hormadaly | 501/20 |
| 7,608,206 | B1 | 10/2009 | Vernooy et al. | |
| 7,951,311 | B2 | 5/2011 | Vernooy et al. | |
| 2007/0184347 | A1 | 8/2007 | Stux et al. | |
| 2009/0261306 | A1 | 10/2009 | Vernooy | |

OTHER PUBLICATIONS

Search Report, mailed Nov. 2, 2012.
U.S. Appl. No. 13/100,540, filed May 4, 2011, Carroll et al.
U.S. Appl. No. 13/100,550, filed May 4, 2011, Carroll et al.
U.S. Appl. No. 13/100,563, filed May 4, 2011, Carroll et al.
U.S. Appl. No. 13/100,533, filed May 4, 2011, Carroll et al.
U.S. Appl. No. 13/100,619, filed May 4, 2011, Mikeska et al.
U.S. Appl. No. 13/438,093, filed Apr. 3, 2012, Hang et al.

* cited by examiner

*Primary Examiner* — Mark Kopec

(57) ABSTRACT

The present invention is directed to an electrically conductive composition comprising (i) an electrically conductive metal, (ii) a component selected from the group consisting of $Li_2RuO_3$, ion-exchanged $Li_2RuO_3$ and mixtures thereof, and (iii) a glass frit all dispersed in an organic medium. The present invention is further directed to an electrode formed from the composition and a semiconductor device and, in particular, a solar cell comprising such an electrode. The electrodes provide good adhesion and good electrical performance.

12 Claims, 1 Drawing Sheet

CONDUCTIVE COMPOSITIONS CONTAINING $LI_2RUO_3$ AND ION-EXCHANGED $LI_2RUO_3$ AND THEIR USE IN THE MANUFACTURE OF SEMICONDUCTOR DEVICES

FIELD OF THE INVENTION

The present invention is directed primarily to an electrically conductive composition, e.g., a thick-film paste or ink and electrodes formed from the electrically conductive composition. It is further directed to a silicon semiconductor device and, in particular, it pertains to the use of the electrically conductive composition in the formation of an electrode for a solar cell.

TECHNICAL BACKGROUND OF THE INVENTION

A conventional solar cell structure with a p-type base has a negative electrode that is typically on the front-side or sun side of the cell and a positive electrode on the back side. Radiation of an appropriate wavelength falling on a p-n junction of a semiconductor body serves as a source of external energy to generate electron-hole pairs in that body. Because of the potential difference which exists at a p-n junction, holes and electrons move across the junction in opposite directions and thereby give rise to a flow of electric current that is capable of delivering power to an external circuit. Most solar cells are in the form of a silicon wafer that has been metallized, i.e., provided with metal electrodes that are electrically conductive. Typically thick-film pastes or inks (sometimes referred to simply as "pastes" hereafter) are screen-printed onto the substrate and fired to form the electrodes.

The front or sun side of the silicon wafer is often coated with an anti-reflective coating (ARC) to prevent reflective loss of incoming sunlight, thus increasing the efficiency of the solar cell. Typically, a two-dimensional electrode grid pattern, i.e. "front electrode," makes a connection to the n-side of the silicon, and a coating of aluminum on the opposite side (back electrode) makes connection to the p-side of the silicon. These contacts are the electrical outlets from the p-n junction to the outside load.

The front electrodes of silicon solar cells are generally formed by screen-printing a paste. Typically, the paste contains electrically conductive particles, glass frit and an organic medium. After screen-printing, the wafer and paste are fired in air, typically at furnace setpoint temperatures of about 650-1000° C. for a few seconds to form a dense solid of electrically conductive traces. The organic components are burned away in this firing step. Also during this firing step, the glass frit and any added flux reacts with and etches through the anti-reflective coating and facilitates the formation of intimate silicon-electrode contact. The glass frit and any added flux also provide adhesion to the substrate and aid in the adhesion of subsequently soldered leads to the electrode. Good adhesion to the substrate and high solder adhesion of the leads to the electrode are important to the performance of the solar cell as well as the manufacturability and reliability of the solar modules, There is an on-going effort to provide paste compositions that result in improved adhesion while maintaining electrical performance.

SUMMARY OF THE INVENTION

The present invention provides an electrically conductive composition comprising:

(a) an electrically conductive metal;

(b) a component selected from the group consisting of $Li_2RuO_3$, ion-exchanged $Li_2RuO_3$ and mixtures thereof;

(c) a glass frit; and (d) an organic medium;

wherein the electrically conductive metal, the component selected from the group consisting of $Li_2RuO_3$, ion-exchanged $Li_2RuO_3$ and mixtures thereof, and the glass frit are dispersed in the organic medium.

The invention also provides a semiconductor device, and in particular, a solar cell comprising an electrode formed from the instant composition, wherein the composition has been fired to remove the organic medium and form the electrode.

Figure 1A:
FIGS. 1A-1F illustrate the fabrication of a semiconductor device.

Reference numerals shown in FIG. 1 are explained below.

10: p-type silicon substrate
20: n-type diffusion layer
30: ARC (e.g., silicon nitride film, titanium oxide film, or silicon oxide film)
40: p+ layer (back surface field, BSF)
60: aluminum paste deposited on back side
61: aluminum back side electrode (obtained by firing back side aluminum paste)
70: silver/aluminum paste deposited on back side
71: silver/aluminum back side electrode (obtained by firing back side silver/aluminum paste)
500: paste of the instant invention deposited on front side
501: front electrode (formed by firing front side paste 500)

DETAILED DESCRIPTION OF THE INVENTION

The electrically conductive composition of the instant invention simultaneously provides the ability to form an electrode wherein the electrode has good electrical and improved adhesion properties. The composition will typically be in the form of a thick-film paste or an ink that can be printed or applied with the desired pattern, such as by screen-printing, stencil-printing, plating, ink-jet printing, extrusion, shaped or multiple printing, or ribbons.

The electrically conductive composition comprises an electrically conductive metal, a component selected from the group consisting of $Li_2RuO_3$, ion-exchanged $Li_2RuO_3$ and mixtures thereof, a glass frit, and an organic medium. In one embodiment, the composition comprises 75-90 wt % electrically conductive metal, 0.03-5 wt % component selected from the group consisting of $Li_2RuO_3$, ion-exchanged $Li_2RuO_3$ and mixtures thereof, 0.5-5 wt % glass frit and 5-25 wt % organic medium, wherein the electrically conductive metal, the component selected from the group consisting of $Li_2RuO_3$, ion-exchanged $Li_2RuO_3$ and mixtures thereof, and the glass frit are dispersed in the organic medium and wherein the wt % are based on the total weight of the composition.

Each constituent of the composition of the present invention is explained in detail below.

Electrically Conductive Metal

The electrically conductive metal is selected from the group consisting of silver, copper, nickel, aluminum and palladium. The source of the electrically conductive metal can be in a flake form, a spherical form, a granular form, a crystalline form, a powder, or other irregular forms and mixtures thereof. The electrically conductive metal can be provided in a colloidal suspension. In one embodiment the composition contains 75-90 wt % electrically conductive metal, wherein the wt % is based on the total weight of the composition.

In one embodiment, the electrically conductive metal is silver (Ag). The silver can be in the form of silver metal, alloys of silver, or mixtures thereof. Typically, in a silver powder, the silver particles are in a flake form, a spherical form, a granular form, a crystalline form, other irregular forms and mixtures thereof. The silver can be provided in a colloidal suspension. The silver can also be in the form of silver oxide ($Ag_2O$), silver salts such as AgCl, $AgNO_3$, $AgOOCCH_3$ (silver acetate), $AgOOCF_3$ (silver trifluoroacetate), silver orthophosphate ($Ag_3PO_4$), or mixtures thereof. Other forms of silver compatible with the other constituents can also be used.

In one embodiment, the electrically conductive composition comprises coated silver particles that are electrically conductive. Suitable coatings include surfactants and phosphorous-containing compounds, Suitable surfactants include polyethyleneoxide, polyethyleneglycol, benzotriazole, poly (ethyleneglycol)acetic acid, lauric acid, oleic acid, capric acid, myristic acid, linolic acid, stearic acid, palmitic acid, stearate salts, palmitate salts, and mixtures thereof. The salt counter-ions can be ammonium, sodium, potassium, and mixtures thereof.

The particle size of the silver is not subject to any particular limitation. In one embodiment, the average particle size is less than 10 microns; in another embodiment, the average particle size is in the range of 1 to 6 microns.

In one embodiment, the electrically conductive metal further comprises a metal selected from the group consisting of nickel, aluminum and mixtures thereof.

The instant composition comprises 50-90 wt % electrically conductive metal, based on the total weight of the composition.

$Li_2RuO_3$, Ion-Exchanged $Li_2RuO_3$ and Mixtures Thereof

The electrically conductive composition contains a component selected from the group consisting of $Li_2RuO_3$, ion-exchanged $Li_2RuO_3$ and mixtures thereof. This component results in improved adhesion of electrodes made formed from the instant composition. In one embodiment, the composition contains 0.03-5 wt % of this component, wherein the wt % is based on the total weight of the composition. In another embodiment, the composition contains 0.06-3 wt % of this component. In still another embodiment, the composition contains 0.1-1 wt % of this component In one embodiment, the component contains $Li_2RuO_3$. The structure of $Li_2RuO_3$, as discussed in James and Goodenough; *Journal of Solid State Chemistry* 74, pp. 287-294, 1988, is composed in general of two adjacent, alternating layers, one layer containing only Li ions and the other containing both Ru and Li ions (ignoring the oxygen atoms).

In another embodiment, the component contains ion-exchanged $Li_2RuO_3$, "Ion-exchanged $Li_2RuO_3$" is used herein to describe particles of $Li_2RuO_3$ in which Li atoms have been at least partially exchanged for Al, Ga, K, Ca, Mn, Fe, Mg, H, Na, Cr, Co, Ni, V, Cu, Zn, Ti or Zr atoms, or a combination thereof. The ion-exchanged $Li_2RuO_3$ is described by the formula $M^{+1}{}_xM^{+2}{}_yM^{+3}{}_zLi_{2-x-2y-3z}RuO_3$ where $(x+2y+3z)\leq 1.5$, and where M is selected from one or more members of the group consisting of Al, Ga, K, Ca, Mn, Fe, Mg, Na, H, Cr, Co, Ni, V, Cu, Zn, Ti and Zr. The Li-only layer of the $Li_2RuO_3$ structure is believed to contain about 75 mole % of the lithium in the structure, and these lithium ions may be readily removed via ion exchange. Although the lithium ions are mobile in the Li-only layer of $Li_2RuO_3$, cations which have higher valence than Li (such as $Mg^{+2}$ or $Al^{+3}$) are less mobile because of their higher charge and concomitant stronger bonding. Thus, it is believed that the exchanging ion, such as magnesium, first displaces lithium ions at or near the surface of the particle, and in the layer that is Li-only, and remains in essentially that position. The more magnesium ions that are available to exchange with the lithium ions, however, the deeper into the particle the magnesium ions will travel until all the exchangeable lithium has been removed or the magnesium ions in solution are exhausted. When Li ions in the Li-only layer are replaced by an amount of exchanging ions that is not significantly greater than the amount of Li ions in that layer, this tends to produce a particle with a surface shell containing exchanged ions in the original Li-only layer and an internal core of remaining Li ions.

To effect the exchange of Li ions in $Li_2RuO_3$, particles of $Li_2RuO_3$ are preferably milled to a diameter in the range of between about 0.5 and about 5 microns, which is a size range that is generally suitable for later screen-printing to form an electrode, for instance. Any wet or dry milling technique can be used to effect size reduction of the $Li_2RuO_3$ particles, such as vibratory miffing, ball milling, hammer milling, media milling, bead milling, rod milling, jet milling, or disk miffing. The milling step can be performed sequentially prior to, or simultaneously while, the ion exchange step is being performed. The milling and ion exchange steps can be performed in separate vessels, or in the same vessel.

In one embodiment, to preserve what is essentially a core-shell arrangement, the milling of the particles should be complete, or substantially complete, before the ion-exchange step. If milling continues after the ion-exchange process is complete, it is expected that the non-ion-exchanged cores will then be exposed on the fresh surfaces which result from the milling. This may or may not be important to the subsequent chemistry of the particles.

During the ion-exchange step, the particles are agitated, by stirring or milling or other suitable means, in a solution containing ions of Al, Ga, K, Ca, Mn, Fe, Na, H, Cr, Co, Ni, V, Cu, Zn, Ti, Zr or mixtures thereof. The ions are obtained by dissolving a soluble salt of the desired element a suitable solvent, preferably water or a mixture of water and a water-miscible solvent, such as an organic liquid such as methanol. Upon exposure to the salt solution, lithium atoms within the $Li_2RuO_3$ particles are replaced with cations from the solution. The making of ion-exchanged $Li_2RuO_3$ is further discussed in VerNooy et al. U.S. Pat. No. 7,608,206.

In still another embodiment, the component contains a mixture of $Li_2RuO_3$ and ion-exchanged $Li_2RuO_3$.

Glass Frit

Various glass frits are useful in forming the instant composition. In one embodiment the composition contains 0.5-5 wt % glass frit, wherein the wt % is based on the total weight of the composition.

Glass compositions, also termed glass frits, are described herein as including percentages of certain components. Specifically, the percentages are the percentages of the components used in the starting material that was subsequently processed as described herein to form a glass composition. Such nomenclature is conventional to one of skill in the art. In other words, the composition contains certain components, and the percentages of those components are expressed as a percentage of the corresponding oxide form, As recognized by one of ordinary skill in the art in glass chemistry, a certain portion of volatile species may be released during the process of making the glass. An example of a volatile species is oxygen. It should also be recognized that while the glass behaves as an amorphous material it will likely contain minor portions of a crystalline material.

If starting with a fired glass, one of ordinary skill in the art may calculate the percentages of starting components described herein using methods known to one of skill in the art including, but not limited to: Inductively Coupled Plasma-Mass Spectroscopy (ICP-MS), Inductively Coupled Plasma-Atomic Emission Spectroscopy (ICP-AES), and the like. In addition, the following exemplary techniques may be used: X-Ray Fluorescence spectroscopy (XRF); Nuclear Magnetic Resonance spectroscopy (NMR); Electron Paramagnetic Resonance spectroscopy (EPR); Mössbauer spectroscopy; electron microprobe Energy Dispersive Spectroscopy (EDS); electron microprobe Wavelength Dispersive Spectroscopy (WDS); or Cathodo-Luminescence (CL).

One of ordinary skill in the art would recognize that the choice of raw materials could unintentionally include impurities that may be incorporated into the glass during processing. For example, the impurities may be present in the range of hundreds to thousands ppm. The presence of the impurities would not alter the properties of the glass, the composition, e.g. a thick-film composition, or the fired device. For example, a solar cell containing a thick-film composition may have the efficiency described herein, even if the thick-film composition includes impurities. "Lead-free" as used herein means that no lead has been intentionally added.

The various glass frits may be prepared by mixing the oxides to be incorporated therein (or other materials that decompose into the desired oxides when heated) using techniques understood by one of ordinary skill in the art. Such preparation techniques may involve heating the mixture in air or an oxygen-containing atmosphere to form a melt, quenching the melt, and grinding, milling, and/or screening the quenched material to provide a powder with the desired particle size. Melting the mixture of bismuth, tellurium, and other oxides to be incorporated therein is typically conducted to a peak temperature of 800 to 1200° C. The molten mixture can be quenched, for example, on a stainless steel platen or between counter-rotating stainless steel rollers to form a platelet. The resulting platelet can be milled to form a powder. Typically, the milled powder has a $d_{50}$ of 0.1 to 3.0 microns. One skilled in the art of producing glass frit may employ alternative synthesis techniques such as but not limited to water quenching, sol-gel, spray pyrolysis, or others appropriate for making powder forms of glass.

The oxide product of the above process is typically essentially an amorphous (non-crystalline) solid material, i.e., a glass. However, in some embodiments the resulting oxide may be amorphous, partially amorphous, partially crystalline, crystalline or combinations thereof. As used herein "glass frit" includes all such products.

The glass frit may be lead-containing or lead-free.

Examples of typical lead-free glass frits useful in the composition include bismuth silicates, bismuth borosilicates, bismuth-tellurium oxides and mixtures thereof.

In one embodiment of lead-free glass frits the oxide constituents are in the compositional range of 55-90 wt % $Bi_2O_3$, 0.5-35 wt % $SiO_2$, 0-5 wt % $B_2O_3$, 0-5 wt % $Al_2O_3$ and 0-15 wt % ZnO, based on the total weight of the glass composition. In another embodiment the oxide constituents are in the compositional range of 28-85 wt % $Bi_2O_3$, 0.1-18 wt % $SiO_2$, 1-25 wt % $B_2O_3$, 0-6 wt % $Al_2O_3$, 0-1 wt % CaO, 0-42 wt % ZnO, 0-4 wt % $Na_2O$, 0-3.5 wt % $Li_2O$, 0-3 wt % $Ag_2O$, 0-4.5 wt % $CeO_2$, 0-3.5 wt % $SnO_2$ and 0-15 wt % $BiF_3$.

The starting mixture used to make the Bi—Te—O glass frit includes 22 to 42 wt % $Bi_2O_3$ and 58 to 78 wt % $TeO_2$, based on the total weight of the starting mixture of the Bi—Te—O. In a further embodiment, in addition to the $Bi_2O_3$ and $TeO_2$, the starting mixture used to make the Bi—Te—O includes 0.1 to 7 wt % $Li_2O$ and 0.1 to 4 wt % $TiO_2$, based on the total weight of the starting mixture of the Bi—Te—O. In a still further embodiment, the starting mixture includes 0.1 to 8 wt % $B_2O_3$, 0.1 to 3 wt % ZnO and 0.3 to 2 wt % $P_2O_5$, again based on the total weight of the starting mixture of the Bi—Te—O.

Examples of typical lead-containing glass frits useful in the composition include lead silicates, lead borosilicates and lead-tellurium oxides.

In one embodiment of lead-containing glass frits the oxide constituents are in the compositional range of 20-83 wt % PbO, 1-35 wt % $SiO_2$, 01.5-19 wt % $B_2O_3$, 0-35 wt % $Bi_2O_3$, 0-7 wt % $Al_2O_3$, 0-12 wt % ZnO, 0-4 wt % CuO, 0-7 wt % $TiO_2$, 0-5 wt % CdO and 0-30 $PbF_2$, based on the total weight of the glass composition.

The starting mixture used to make the Pb—Te—O glass frit includes 25-65 wt % PbO and 35-75 wt % $Teo_2$, based on the total weight of the starting mixture of the Pb—Te—O. In a further embodiment, in addition to the PbO and $TeO_2$, the starting mixture used to make the Pb—Te—O includes 0.1 to 5 wt % $Li_2O$ and 0.1 to 5 wt % $TiO_2$, based on the total weight of the starting mixture of the Pb—Te—O. This Pb—Te—O can be designated as Pb—Te—Li—Ti—O. In a still further embodiment the starting mixtures used to make Pb—Te—O and Pb—Te—Li—Ti—O include 0.1 to 3 wt % $B_2O_3$ and 0.5 to 5 wt % $Bi_2O_3$.

Organic Medium

The inorganic components of the composition are mixed with an organic medium to form viscous thick-film pastes or less viscous inks having suitable consistency and rheology for printing. A wide variety of inert viscous materials can be used as the organic medium. The organic medium can be one in which the inorganic components are dispersible with an adequate degree of stability during manufacturing, shipping and storage of the pastes or inks, as well as on the printing screen during a screen-printing process.

Suitable organic media have rheological properties that provide stable dispersion of solids, appropriate viscosity and thixotropy for printing, appropriate wettability of the substrate and the paste solids, a good drying rate, and good firing properties. The organic medium can contain thickeners, stabilizers, surfactants, and/or other common additives. One such thixotropic thickener is Thixatrol® (Elementis plc, London, UK). The organic medium can be a solution of polymer(s) in solvent(s). Suitable polymers include ethyl cellulose, ethylhydroxyethyl cellulose, wood rosin, mixtures of ethyl cellulose and phenolic resins, polymethacrylates of lower alcohols, and the monobutyl ether of ethylene glycol monoacetate. Suitable solvents include terpenes such as alpha- or beta-terpineol or mixtures thereof with other solvents such as kerosene, dibutylphthalate, butyl carbitol, butyl carbitol acetate, hexylene glycol and alcohols with boiling points above 150° C., and alcohol esters. Other suitable organic medium components include: bis(2-(2-butoxyethoxy)ethyl adipate, dibasic esters such as DBE, DBE-2, DBE-3, DBE-4, DBE-5, DBE-6, DBE-9, and DBE 1B, octyl epoxy tallate, isotetradecanol, and pentaerythritol ester of hydrogenated rosin. The organic medium can also comprise volatile liquids to promote rapid hardening after application of the paste composition on a substrate.

The optimal amount of organic medium in the composition is dependent on the method of applying the composition and the specific organic medium used. The instant composition contains 5 to 50 wt % of organic medium, based on the total weight of the composition.

If the organic medium comprises a polymer, the polymer typically comprises 8 to 15 wt % of the organic composition.

Preparation of the Composition

In one embodiment, the composition can be prepared by mixing the electrically conductive metal, the component selected from the group consisting of $Li_2RuO_3$, ion-exchanged $Li_2RuO_3$ and mixtures thereof, the glass frit, and the organic medium in any order. In some embodiments, the inorganic materials are mixed first, and they are then added to the organic medium. In other embodiments, the electrically conductive metal which is the major portion of the inorganics is slowly added to the organic medium. The viscosity can be adjusted, if needed, by the addition of solvents. Mixing methods that provide high shear are useful to disperse the particles in the medium.

Formation of Electrodes

The composition can be deposited, for example, by screen-printing, stencil-printing, plating, extrusion, ink-jet printing, shaped or multiple printing, or ribbons.

In this electrode-forming process, the composition is first dried and then heated to remove the organic medium and sinter the inorganic materials. The heating can be carried out in air or an oxygen-containing atmosphere. This step is commonly referred to as "firing." The firing temperature profile is typically set so as to enable the burnout of organic binder materials from the dried paste composition, as well as any other organic materials present. In one embodiment, the firing temperature is 700 to 950° C. The firing can be conducted in a belt furnace using high transport rates, for example, 100-500 cm/min, with resulting hold-up times of 0.03 to 5 minutes. Multiple temperature zones, for example 3 to 11 zones, can be used to control the desired thermal profile.

In one embodiment, a semiconductor device is manufactured from an article comprising a junction-bearing semiconductor substrate and a silicon nitride insulating film formed on a main surface thereof. The instant composition is applied (e.g., coated or screen-printed) onto the insulating film, in a predetermined shape and thickness and at a predetermined position. The instant composition has the ability to penetrate the insulating layer, either partially or fully. Firing is then carried out and the composition reacts with the insulating film and penetrates the insulating film, thereby effecting electrical contact with the silicon substrate and as a result the electrode is formed.

An example of this method of forming the electrode is described below in conjunction with FIGS. 1A-1F.

FIG. 1A shows a single crystal or multi-crystalline p-type silicon substrate 10.

Figure 1B:
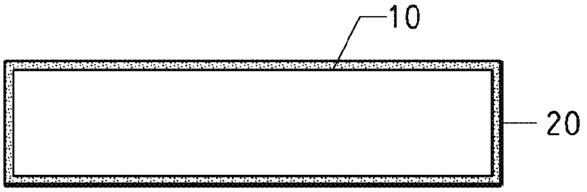

In FIG. 1B, an n-type diffusion layer 20 of the reverse conductivity type is formed by the thermal diffusion of phosphorus using phosphorus oxychloride as the phosphorus source. In the absence of any particular modifications, the diffusion layer 20 is formed over the entire surface of the silicon p-type substrate 10. The depth of the diffusion layer can be varied by controlling the diffusion temperature and time, and is generally formed in a thickness range of about 0.3 to 0.5 microns. The n-type diffusion layer may have a sheet resistivity of several tens of ohms per square up to about 120 ohms per square.

Figure 1C:

After protecting the front surface of this diffusion layer with a resist or the like, as shown in FIG. 1C the diffusion layer 20 is removed from the rest of the surfaces by etching so that it remains only on the front surface. The resist is then removed using an organic solvent or the like.

Figure 1D:
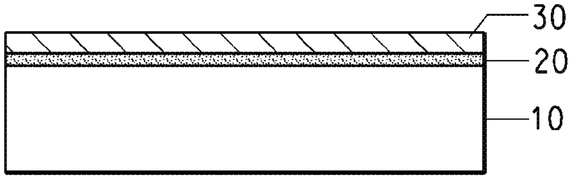

Then, as shown in FIG. 1D an insulating layer 30 which also functions as an anti-reflection coating (ARC) is formed on the n-type diffusion layer 20. The insulating layer is commonly silicon nitride, but can also be a $SiN_x$:H film (i.e., the insulating film comprises hydrogen for passivation during subsequent firing processing), a titanium oxide film, a silicon oxide film, or a silicon oxide/titanium oxide film. A thickness of about 700 to 900 Å of a silicon nitride film is suitable for a refractive index of about 1.9 to 2.0. Deposition of the insulating layer 30 can be by sputtering, chemical vapor deposition, or other methods.

Figure 1E:
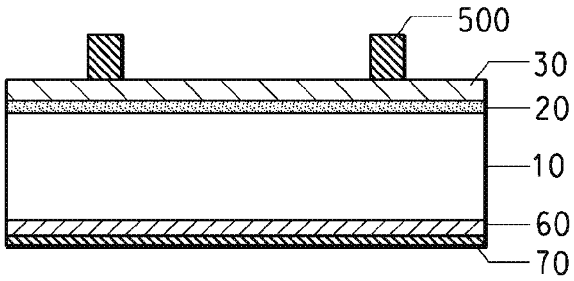

Next, electrodes are formed. As shown in FIG. 1E, the composition of the present invention 500 is screen-printed to create the front electrode on the insulating film 30 and then dried, In addition, a back-side silver or silver/aluminum paste 70, and an aluminum paste 60 are then screen-printed onto the back side of the substrate and successively dried. Firing is carried out in an infrared belt furnace at a temperature range of approximately 750 to 950° C. for a period of from several seconds to several tens of minutes.

Figure 1F:
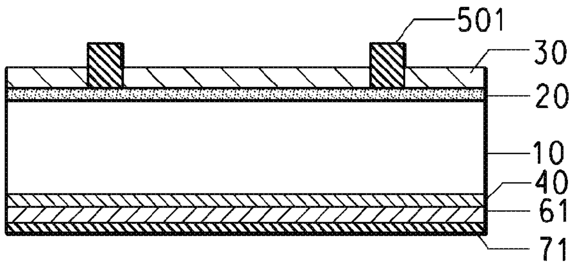

Consequently, as shown in FIG. 1F, during firing, aluminum diffuses from the aluminum paste 60 into the silicon substrate 10 on the back side thereby forming a p+ layer 40 containing a high concentration of aluminum dopant. This layer is generally called the back surface field (BSF) layer, and helps to improve the energy conversion efficiency of the solar cell.

Firing converts the dried aluminum paste 60 to an aluminum back electrode 61. The back-side silver or silver/aluminum paste 70 is fired at the same time, becoming a silver or silver/aluminum back electrode, 71. During firing, the boundary between the back-side aluminum and the back side silver or silver/aluminum assumes the state of an alloy, thereby achieving electrical connection. Most areas of the back electrode are occupied by the aluminum electrode 61, owing in part to the need to form a p+ layer 40. Because soldering to an aluminum electrode is impossible, the silver or silver/aluminum back electrode 71 is formed over portions of the back side as an electrode for interconnecting solar cells by means of copper ribbon or the like. In addition, the front side composition 500 of the present invention sinters and penetrates through the insulating film 30 during firing, and thereby achieves electrical contact with the n-type layer 20. This type of process is generally called "fire through." The fired electrode 501 of FIG. 1F clearly shows the result of the fire through.

EXAMPLES

Solar Cell Electrical Measurements

A commercial Current-Voltage (JV) tester ST-1000 (Telecom-STV Ltd., Moscow, Russia) was used to make efficiency and fill factor measurements of the polycrystalline silicon photovoltaic cells. Two electrical connections, one for voltage and one for current, were made on the top and the bottom of each of the photovoltaic cells. Transient photo-excitation was used to avoid heating the silicon photovoltaic cells and to obtain JV curves under standard temperature conditions (25° C.). A flash lamp with a spectral output similar to the solar spectrum illuminated the photovoltaic cells from a vertical distance of 1 m. The lamp power was held constant for 14 milliseconds. The intensity at the sample surface, as calibrated against external solar cells was 1000 W/$m^2$ (or 1 Sun) during this time period. During the 14 milliseconds, the JV tester varied an artificial electrical load on the sample from short circuit to open circuit. The JV tester recorded the light-induced current through, and the voltage across, the photovoltaic cells while the load changed over the stated range of loads. A power versus voltage curve was obtained from this data by taking the product of the current times the voltage at each voltage level. The maximum of the power versus voltage curve was taken as the characteristic output power of the solar cell for calculating solar cell efficiency. This maximum power was divided by the area of the sample to obtain the maximum power density at 1 Sun intensity. This was then divided by 1000 W/m$^2$ of the input intensity to obtain the efficiency which is then multiplied by 100 to present the result in percent efficiency. Other parameters of interest were also obtained from this same current-voltage curve. One such parameter is fill factor (FF) which is obtained by taking the ratio of the maximum power from the solar cell to the product of open circuit voltage and short circuit current. The FF is defined as the ratio of the maximum power from the solar cell to the product of $V_{OC}$ and $I_{SC}$, multiplied by 100.

Adhesion Measurements

Adhesion of the electrode was measured by the following procedures. A copper ribbon coated with a Sn/Pb solder (Ulbrich Stainless Steels & Special Metals, Inc.) was dipped into a soldering flux (Kester-952s, Kester, Inc.) and then dried for five seconds in air. Half of the solder coated copper ribbon was placed on the bas electrode and soldering was done by a soldering system (SCB-160, SEMTEK Corporation Co., Ltd.). The soldering iron setting temperature was 220 to 240° C. and the actual temperature of the soldering iron at the tip was from 105° C. to 215° C. measured by K-type thermocouple. The rest part of the copper ribbon which did not adhere to the has electrode was horizontally folded and pulled at 120 mm/min by a machine (Peel Force 606, MOGRL Technology Co., Ltd.). The strength (Newton, N) at which the copper ribbon was detached was recorded as the solder adhesion.

Synthesis and Milling of $Li_2RuO_3$

Example 1

18.85 g $Li_2CO_3$ and 33.33 g $RuO_2$ powders were intimately mixed and calcined at 1000° C. for 12 hours in air. An X-ray powder diffraction pattern of the resulting material showed only $Li_2RuO_3$, with no impurity phases.

This material was milled in isopropyl alcohol to a $d_{90}$ of 0.87 micron. The powder was isolated from the slurry, dried, and sieved to −230 mesh.

Preparation of Thick-Film Paste

Example 2

A master batch of thick-film paste was made by mixing the ingredients shown in Table I in the quantities indicated in a Thinky mixer (Thinky Corp., Laguna Hills, Calif.) and three-roll milling the resulting paste with multiple passes at increasing pressure, ending with 2 passes at 250 psi.

TABLE I

| Ingredient | Weight (g) |
|---|---|
| MEDIUM | 32.7593 |
| THIXATROL ST | 1.3299 |
| TEXANOL | 1.0772 |
| SOYA LECITHIN | 2.6709 |
| DRAPEX ® 4.4 | 3.7726 |
| Lead borosilicate frit | 7.5576 |
| Ag powder (flake, $d_{50}$~2 microns) | 130.9404 |
| Ag powder (flake, $d_{50}$~2.5 to 5.5 microns) | 23.9671 |
| Ag powder (flake, $d_{50}$~2 to 5 microns) | 46.5644 |
| Total | 250.6394 |

The medium was prepared by dissolving 7 wt. % N200 Aqualon ethylcellulose (Ashland, Inc., Covington, Ky.) in Texanol. The glass frit was prepared by melting and quenching the quantities of oxides shown in Table II, and then milling the glass to a fine powder.

TABLE II

| Oxide | wt. % |
|---|---|
| SiO2 | 23.00 |
| Al2O3 | 0.40 |
| PbO | 58.80 |
| B2O3 | 7.80 |
| TiO2 | 6.10 |
| CdO | 3.90 |
| Total | 100.00 |

The composition of the invention was prepared using 5.4692 g of the master batch of thick-film paste and mixing it with 0.0439 g $Li_2RuO_3$ (from Example 1) in the Thinky mixer. 0.0361 g additional Texanol was also mixed in to adjust the viscosity. The amount of $Li_2RuO_3$ in this paste composition of the invention was 0.8 wt %, based on the total weight of the composition.

The mixture was mulled on a Hoover M-5 Automatic Muller (Hiwassee, Va.) to thoroughly incorporate the $Li_2RuO_3$. The paste composition of the invention was screen-printed onto 1"×1" Si chips (cur with a wafering saw from 6"×6" 65-ohm multi-crystalline Si wafers with ~70 nm of SiNx antireflective coating on the front side). The pattern consisted of 11 fingers (100 microns wide) and 1 busbar (1.25 mm wide). The back side of each chip was printed with a full ground plane of a commercially available Al paste. After drying 10 minutes at 150° C., the chips were fired at a series of peak temperatures (5 chips per temperature) in a Radiant Technology Corporation PV-614 6-zone belt furnace with a belt speed of 457 cm per minute. The final zone setpoint temperature (the peak setpoint temperature) is reported. The peak mean efficiency was 13.99% at 865° C. and the peak mean FF was 75.14 at 865° C. By comparison, the master batch paste without any $Li_2RuO_3$ added gives very poor efficiency (<4%).

Example 3

The composition of the invention was prepared and tested as described in Example 2 except that 0.0908 g of $Li_2RuO_3$ was mulled into 5.4816 g of the master batch paste and 0.0611 g additional Texanol was added to adjust the viscosity. The amount of $Li_2RuO_3$ in this paste composition of the invention was 1.6 wt %, based on the total weight of the composition. The peak mean efficiency was 14.41% at 890° C. and the peak mean FF was 75.90 at 890° C. By comparison, the master batch paste without any $Li_2RuO_3$ added gives very poor efficiency (<4%).

Example 4

The composition of the invention was prepared and tested as described in Example 2 except that 0.1793 g of $Li_2RuO_3$ was mulled into 5.6127 g of the master batch paste and 0.0386 g additional Texanol was added to adjust the viscosity. The amount of $Li_2RuO_3$ in this paste composition of the invention was 3.2 wt %, based on the total weight of the composition. The peak mean efficiency was 14.53% at 890° C. and the peak mean FF was 76.68 at 890° C. By comparison, the master batch paste without any $Li_2RuO_3$ added gives very poor efficiency (<4%).

Example 5

The composition of the invention was prepared and tested as described in Example 2 except that 0.2437 g of $Li_2RuO_3$ was mulled into 5.0770 g of the master batch paste and 0.0399 g additional Texanol was added to adjust the viscosity. The amount of $Li_2RuO_3$ in this paste composition of the invention was 4.8 wt %, based on the total weight of the composition. The peak mean efficiency was 13.99% at 940° C. and the peak mean FF was 74.44 at 940° C. By comparison, the master batch paste without any $Li_2RuO_3$ added gives very poor efficiency (<4%), Example 6

A composition was prepared by mixing 0.0757 g $Li_2RuO_3$ (from Example 1) and 28.5446 g PV16A paste (DuPont Microcircuit Materials, Wilmington Del.) in the Thinky mixer. 0.1751 g Texanol was added to adjust the viscosity. The amount of $Li_2RuO_3$ in this paste composition of the invention was 0.263 wt %, based on the total weight of the composition.

The resulting paste composition of the invention was three-roll milled (3 passes at 0 psi and 3 passes at 100 psi). The test chips were printed in a similar manner to that described in Example 2. The chips were fired in a 4-zone BTU International IR belt furnace with a belt speed of 221 cm per minute. The peak mean efficiency was 15.41% at 910° C. and the peak mean FF was 79.08 at 910° C.

Example 7

A composition was prepared and tested as described in Example 6 except that 0.1133 g of $Li_2RuO_3$ was mixed with 28.1699 g PV16A paste and 0.1455 g Texanol was added to adjust the viscosity. The amount of $Li_2RuO_3$ in this paste composition of the invention was 0.398 wt %, based on the total weight of the composition. The peak mean efficiency was 15.17% at 920° C. and the peak mean FF was 77.86 at 920° C.

Example 8

A composition was prepared and tested as described in Example 6 except that 0.1373 g of $Li_2RuO_3$ was mixed with 25.9434 g PV16A paste and 0.2372 g Texanol was added to adjust the viscosity. The amount of $Li_2RuO_3$ in this paste composition of the invention was 0.522 wt %, based on the total weight of the composition. The peak mean efficiency was 15.26% at 910° C. and the peak mean FF was 78.42 at 910° C.

Comparative Experiment A

For comparison with Examples 6 through 8, PV16A paste without added $Li_2RuO_3$ was printed and fired as described in Example 6. The peak mean efficiency was 15.16% at 910° C. and the peak mean FF was 78.00 at 910° C.

Example 9

A glass fit was prepared with the composition shown in Table III:

TABLE III

| Oxide | Wt. % |
|---|---|
| PbO | 44.51 |
| $B_2O_3$ | 0.48 |
| $Li_2O$ | 0.44 |
| $Bi_2O_3$ | 6.83 |
| $TeO_2$ | 47.74 |

Two pastes were prepared using this glass frit. Paste A had 1.60 wt. % frit, no lithium ruthenate, 88.83% silver powder, and an organic vehicle consisting of solvents, binders, thixotrope, and surfactant. Paste B was identical to Paste A, except it contained 0.13 wt. % lithium ruthenate. After printing and firing, cells made from the two pastes had similar efficiencies and fill factors. However, the median adhesion of Paste A was 1.28 N with a busbar thickness of 11.5 microns, while the median adhesion of Paste B was 3.16 N with a busbar thickness of 10.35 microns, a 247% increase in adhesion.

Example 10

Two pastes were prepared using the glass frit of Example 9. Paste C had 1.69% frit, no lithium ruthenate, 88.73% silver powder, and an organic vehicle consisting of solvents, binders, thixotrope, and surfactant. Paste D had 1.69% frit, 0.1% lithium ruthenate, 88.63% silver powder, and the same organic vehicle as Paste C. Two additional pastes were prepared by blending Pastes C and D to achieve intermediate lithium ruthenate levels. After printing and firing, the adhesion and bulbar thicknesses were measured. The results of these measurements are shown in Table IV.

TABLE IV

| $Li_2RuO_3$ (wt. %) | Adhesion (median) (N) | Busbar thickness (μm) |
|---|---|---|
| 0 | 1.39 | 8.69 |
| 0.010 | 1.72 | 8.35 |
| 0.025 | 1.61 | 8.50 |
| 0.050 | 2.21 | 8.44 |
| 0.100 | 2.54 | 8.34 |

What is claimed is:

1. An electrically conductive composition comprising:

(a) an electrically conductive metal;

(b) a component selected from the group consisting of $Li_2RuO_3$, ion-exchanged $Li_2RuO_3$ and mixtures thereof;

(c) a glass frit; and (d) an organic medium;

wherein said electrically conductive metal, said component selected from the group consisting of $Li_2RuO_3$, ion-exchanged $Li_2RuO_3$ and mixtures thereof, and said glass frit are dispersed in said organic medium.

2. The composition of claim 1, said composition comprising 50-90 wt % electrically conductive metal, 0.03-5 wt % component selected from the group consisting of $Li_2RuO_3$, ion-exchanged $Li_2RuO_3$ and mixtures thereof, 0.5-5 wt % glass frit and 5-50 wt % organic medium, wherein said wt % are based on the total weight of said composition.

3. The composition of claim 2, said composition comprising, 0.1-1 wt % component selected from the group consisting of $Li_2RuO_3$, ion-exchanged $Li_2RuO_3$ and mixtures thereof, wherein said wt % are based on the total weight of said composition.

4. The composition of claim 1, wherein said component is $Li_2RuO_3$.

5. The composition of claim 1, wherein said component is ion-exchanged $Li_2RuO_3$, wherein Li atoms have been at least partially exchanged for Al, Ga, K, Ca, Mn, Fe, Mg, H, Na, Cr, Co, Ni, V, Cu, Zn, Ti or Zr atoms, or a combination thereof.

6. The composition of claim 1, said electrically conductive metal comprising a metal selected from the group consisting of silver, copper, palladium and mixtures thereof.

7. The composition of claim 6, said electrically conductive metal further comprising a metal selected from the group consisting of nickel, aluminum and mixtures thereof.

8. The composition of claim 6, said electrically conductive metal comprising silver.

9. The composition of claim 1, said glass frit comprising a lead-containing glass frit selected from the group consisting of lead silicates, lead borosilicates, lead-tellurium-oxides and mixtures thereof.

10. The composition of claim 1, said glass frit comprising a lead-free glass frit selected from the group consisting of bismuth silicates, bismuth borosilicates, bismuth-tellurium-oxides and mixtures thereof.

11. A semiconductor device comprising an electrode formed from the composition of claim 1, wherein said composition has been fired to remove the organic medium and form said electrode.

12. A solar cell comprising an electrode formed from the composition of any of claims 1-10, wherein said composition has been fired to remove the organic medium and form said electrode.

* * * * *

UNITED STATES PATENT AND TRADEMARK OFFICE

CERTIFICATE OF CORRECTION

PATENT NO. : 8,808,581 B2
APPLICATION NO. : 13/568260
DATED : August 19, 2014
INVENTOR(S) : Paul Douglas Vernooy et al.

It is certified that error appears in the above-identified patent and that said Letters Patent is hereby corrected as shown below:

In the Specification

Column 3, Line 18, please change "compounds," to read -- compounds. --.

Column 3, Line 45, please change "component" to read -- component. --.

Column 4, Line 22, please change "miffing" to read -- milling. --.

Column 4, Line 39, after "element" please insert -- in --.

Column 6, Line 17, please change "$Teo_2$" to read -- $TeO_2$. --.

Column 9, Line 20, please change "bas" to read -- base --.

Column 9, Line 24, please change "105°C" to read -- 195°C --.

Column 9, Line 26, please change "has" to read -- base --.

Column 10, Line 29, please change "cur" to read -- cut --.

Column 12, Line 31, please change "bulbar" to read -- busbar --.

Signed and Sealed this
Twenty-first Day of October, 2014

Michelle K. Lee

Michelle K. Lee
*Deputy Director of the United States Patent and Trademark Office*